United States Patent
Allenspach et al.

(10) Patent No.: US 9,853,205 B1
(45) Date of Patent: Dec. 26, 2017

(54) SPIN TRANSFER TORQUE MAGNETIC TUNNEL JUNCTION WITH OFF-CENTERED CURRENT FLOW

(71) Applicant: International Business Machines Corporation, Armonk, NY (US)

(72) Inventors: Rolf Allenspach, Adliswil (CH); Anthony J. Annunziata, Stamford, CT (US); Daniel C. Worledge, Cortlandt Manor, NY (US); See-Hun Yang, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/283,329

(22) Filed: Oct. 1, 2016

(51) Int. Cl.
  *G11C 11/00* (2006.01)
  *H01L 43/02* (2006.01)
  *H01L 43/08* (2006.01)
  *H01L 43/10* (2006.01)
  *G11C 11/16* (2006.01)

(52) U.S. Cl.
  CPC ............ *H01L 43/02* (2013.01); *G11C 11/161* (2013.01); *G11C 11/1675* (2013.01); *H01L 43/08* (2013.01); *H01L 43/10* (2013.01)

(58) Field of Classification Search
  CPC ... G11C 11/161; G11C 11/1675; G01L 43/02; H01L 38/08
  USPC .......................................................... 365/158
  See application file for complete search history.

(56) References Cited

U.S. PATENT DOCUMENTS

| 7,313,013 | B2 | 12/2007 | Sun et al. | |
|---|---|---|---|---|
| 7,602,000 | B2 | 10/2009 | Sun et al. | |
| 7,943,399 | B2 | 5/2011 | Sun et al. | |
| 8,558,332 | B2 | 10/2013 | Sun et al. | |
| 8,860,105 | B2 | 10/2014 | Sun et al. | |
| 2014/0103470 | A1* | 4/2014 | Shukh | H01L 29/82 257/421 |
| 2015/0129995 | A1* | 5/2015 | Wang | G11C 11/18 257/421 |
| 2016/0087193 | A1 | 3/2016 | Pinarbasi et al. | |

OTHER PUBLICATIONS

J.C. Slonczewski, Current-driven excitation of magnetic multilayers, J. Magn. Magn. Mater. 159, L1 (1996), pp. 1.1-1.7.

(Continued)

*Primary Examiner* — Anthan Tran
(74) *Attorney, Agent, or Firm* — Daniel P. Morris; Otterstedt, Ellenbogen & Kammer, LLP

(57) ABSTRACT

A spin-transfer torque magnetic tunnel junction includes a layer stack with a pinned magnetic layer and a free magnetic layer, and an insulating barrier layer there-between. Each of the magnetic layers has an out-of-plane magnetization orientation. The junction is configured so as to allow a spin-polarized current flow generated from one of the two magnetic layers to the other to initiate an asymmetrical switching of the magnetization orientation of the free layer. The switching is off-centered toward an edge of the stack. The junction may allow a spin-polarized current flow that is off-centered toward an edge of the stack, from one of the two magnetic layers to the other, to initiate the asymmetrical switching. Related devices and methods of operation are also provided.

17 Claims, 4 Drawing Sheets

(56) References Cited

OTHER PUBLICATIONS

L. Berger, Emission of spin waves by a magnetic multilayer traversed by a current, Phys. Rev. B 54:13, 9353-9358 (1996).
M. Nakayama, T. Kai, N. Shimomura, M. Amano, E. Kitagawa, T. Nagase, M. Yoshikawa, T. Kishi, S. Ikegawa, and H. Yoda, Spin transfer switching in Tb Co Fe/Co Fe B/Mg O/Co Fe B/Tb Co Fe magnetic tunnel junctions with perpendicular magnetic anisotropy, J. Appl. Phys. 103, 07A710 (2008),. p. 07A710-1 to 07A710-3.
S. Ikeda, K. Miura, H. Yamamoto, K. Mizunuma, H. D. Gan, M. Endo, S. Kanai, J. Hayakawa, F. Matsukura, and H. Ohno, A perpendicular-anisotropy CoFeB—MgO magnetic tunnel junction, Nature Mater. 9, p. 721-724 (2010).
D.C. Worledge, G. Hu, D.W. Abraham, J.Z. Sun, P.L. Trouilloud, J. Nowak, S. Brown, M.G. Gaidis, E.J. O'Sullivan, and R. P. Robertazzi, Spin torque switching of perpendicular TaCoFeBMgO-based magnetic tunnel junctions, Appl. Phys. Lett. 98, 022501 (2011) pp. 022501-1 to 022501-3.
A. Vanhaverbeke, OOMMF extension of spin-transfer torque terms for current-induced domain wall motion, 2008, downloaded from https://www.zurich.ibm.com/st/magnetism/spintevolve.html Oct. 1, 2016 pp. 1-2 (IBM Research—Zurich | Science & Technology | Nanoscale science | Nanomagnetism OOMMF extension for current-induced domain wall motion).
M. Najafi, B. Krüger, S. Bohlens, M. Franchin, H. Fangohr, A. Vanhaverbeke, R. Allenspach, M. Bolte,U. Merkt, D. Pfannkuche, D.P.F. Möller, and G. Meier, Proposal for a standard problem for micromagnetic simulations including spin-transfer torque, J. Appl. Phys. 105, 113914-1 to 113914-8 (2009).
C.Y. You, Micromagnetic Simulations for Spin Transfer Torque in Magnetic Multilayers, J. Magnetics 17(2), 73-77 (2012).
Lavinia Elena NISTOR/M. James M. D. Coey et al. (jury), Magnetic tunnel junctions with perpendicular magnetization: anisotropy, magnetoresistance, magnetic coupling and spin transfer torque switching, Thesis, Oct. 7, 2011, Sigillum Universitatis Gratianopolitane, Université De Grenoble, p. 1-206 plus cover materials.

\* cited by examiner

SPIN TRANSFER TORQUE MAGNETIC TUNNEL JUNCTION WITH OFF-CENTERED CURRENT FLOW

BACKGROUND

The invention relates in general to spin transfer torque magnetic tunnel junctions (STT-MTJs), spin-transfer torque magnetic random access memories (STT-MRAMs) and, in particular, to perpendicularly magnetized STT-MTJs.

Perpendicularly magnetized devices, and in particular perpendicular STT-MRAMs, are known. Such devices are for instance discussed in the U.S. Pat. No. 7,602,000, U.S. Pat. No. 7,313,013, U.S. Pat. No. 7,943,399, U.S. Pat. No. 8,558,332, and U.S. Pat. No. 8,860,105.

It is generally believed that scaling challenges will prevent dynamic random-access memory (DRAM) and static random-access memory (SRAM) devices from functioning properly in coming technology nodes with the expected specifications. MRAM technology, in contrast, profits from two game-changing innovations.

The first innovation is based on the discovery that the magnetization of a nanoscale ferromagnet can be switched by a spin-polarized current [1,2]. An unpolarized current acquires a spin polarization by the electrons scattering in a ferromagnet. The spin imbalance that results can be transferred to the magnetic layer, eventually flipping its magnetization. Thus, writing to a memory cell—or switching its magnetization—no longer requires magnetic fields but can be achieved thanks to a short current pulse.

The second innovation is a materials engineering achievement. Originally, the magnetic layers in the magnetic tunnel junction (MTJ) were magnetized in-plane, driven by shape anisotropy. A few years ago, it was shown that magnetic materials like CoFeB can be tailored to exhibit "perpendicular" magnetization, i.e., where the magnetic orientation is out-of-plane, if the thickness of the element is small enough (typically 1 nm) [3,4,5]. A perpendicularly magnetized MTJ is advantageous over an in-plane magnetized MTJ because of its higher efficiency in switching the free layer, i.e. the minimal current needed for switching is reduced. The minimum current required for switching, often denoted by $Ic_0$, depends on three material parameters: the damping constant $\alpha$, the anisotropy barrier $E_b$, and the spin-transfer efficiency $\zeta$. Low-power devices require $Ic_0$ to be small, which, in turn, requires favorable material parameters. Efforts are thus usually invested in order to identify more favorable material parameters.

Attention is drawn to the following references:
[1] J. C. Slonczewski, J. Magn. Magn. Mater. 159, L1 (1996).
[2] L. Berger, Phys. Rev. B 54, 9353 (1996).
[3] M. Nakayama, T. Kai, N. Shimomura, M. Amano, E. Kitagawa, T. Nagase, M. Yoshikawa, T. Kishi, S. Ikegawa, and H. Yoda, J. Appl. Phys. 103, 07A710 (2008).
[4] S. Ikeda, K. Miura, H. Yamamoto, K. Mizunuma, H. D. Gan, M. Endo, S. Kanai, J. Hayakawa, F. Matsukura, and H. Ohno, Nature Mater. 9, 721 (2010).
[5] D. C. Worledge, G. Hu, D. W. Abraham, J. Z. Sun, P. L. Trouilloud, J. Nowak, S. Brown, M. C. Gaidis, E. J. O'Sullivan, and R. P. Robertazzi, Appl. Phys. Lett. 98, 022501 (2011).
[6] For the code, see A. Vanhaverbeke, OOMMF extension of spin-transfer torque terms for current-induced domain wall motion, 2008, http colon // www dot Zurich dot ibm dot com/st/magnetism/spintevolve dot html, see also, for an application, M. Najafi, B. Krüger, S. Bohlens, M. Franchin, H. Fangohr, A. Vanhaverbeke, R. Allenspach, M. Bolte, U. Merkt, D. Pfannkuche, D. P. F. Möller, and G. Meier, J. Appl. Phys. 105, 113914 (2009).
[7] C. Y. You, J. Magnetics 17, 73 (2012).

SUMMARY

According to a first aspect, the present invention is embodied as a spin-transfer torque magnetic tunnel junction. The latter comprises a layer stack with two magnetic layers, i.e., a pinned layer and a free layer, and an insulating barrier layer between the two magnetic layers. Each of the two magnetic layers has an out-of-plane magnetization orientation. The junction is otherwise configured so as to allow a spin-polarized current flow generated from one of the two magnetic layers to the other to initiate an asymmetrical switching of the magnetization orientation of the free layer, whereby said switching is off-centered toward an edge of the stack.

The junction may for instance allow a spin-polarized current flow that is off-centered toward an edge of the stack, from one of the two magnetic layers to the other, to initiate the asymmetrical switching of the free layer.

The present solutions rely on out-of-plane magnetization orientations, which are advantageous over in-plane magnetized junctions because of their higher efficiency in switching the free layer. I.e., the switching current can be reduced, which already enables lower power devices compared with in-plane magnetized devices. All the more, the present junctions are designed so as to allow an asymmetric switching of the free layer, e.g., using current flows that are off-centered toward an edge of the stack. This, as present Inventors discovered, results in further decreasing the minimal switching current with respect to centered current flows, e.g., by a factor of two. For example, the junction may be configured so as to have a switching current that is less than 50 µA at a switching rate of 0.1 $ns^{-1}$.

Various practical realizations can be contemplated to achieve an off-centered current constriction. For instance, in embodiments, the insulating barrier layer of the magnetic tunnel junction has a laterally varying thickness, so as to exhibit a reduced thickness at an edge thereof. This way, the current flow generated across the junction is off-centered toward the edge of reduced thickness. The laterally varying thickness may for instance vary from a first value $h_1$ to a second value $h_2$, wherein $0.5\ h_2 \leq h_1 < h_2$.

In other embodiments, off-centering the switching is achieved thanks to laterally varying magnetic properties. Namely, the free layer and/or an interface between the free layer and the insulating barrier layer may have one or more laterally varying magnetic properties, so as to off-center the switching of the free layer. This may involve an off-centered current flow, or not. I.e., an asymmetrical switching may even occur if the generated current flow is symmetric, provided certain conditions are met. The laterally varying magnetic properties shall preferably include a magnetization and/or a magnetic anisotropy of the free layer and/or said interface.

In other embodiments, one, or each of the pinned layer and the insulating barrier layer has an average diameter that is less than the average diameter of the free layer and is furthermore off-centered toward an edge of the stack. This too results in off-centering the generated current flow, in operation. The above diameters are measured, each, in a plane perpendicular to the stacking direction. A similar effect can still be obtained by designing the insulating barrier layer so as for it to have a laterally varying electron transmission probability, e.g., by laterally varying a dopant concentration in the insulating barrier.

The junction shall preferably be designed so that the distance l by which said current flow is off-centered from a center of the free layer fulfills the condition 2 nm≤l<D/2, where D is the average diameter of the free layer. The quantities l and D are measured in the average plane of the free layer, perpendicularly to the stacking direction of the stack.

In preferred embodiments, the junction may be designed so that the average diameter d of the current filament along which the current flows occurs, in operation, fulfills the condition $L_e \leq d < D/2$, where $L_e$ represents an average exchange length of the two magnetic layers. The average exchange length $L_e$ of the two magnetic layers may typically be between 3 nm and 6 nm. The average diameter d may for example fulfill the condition 4 nm≤d≤D/2.

On the other hand, the average diameter D of the stack shall preferably be larger than 6 nm. It should, in most applications, be typically less than or equal to 100 nm, and preferably less than or equal to 32 nm.

In embodiments, each of the two magnetic layers comprises a CoFeB compound whereas the insulating barrier layer may for example comprise MgO. The free layer may for instance have an average thickness that is between 1 nm and 4 nm, while the average thickness of the pinned layer is preferably between 6 nm and 10 nm. The insulating barrier layer should preferably have an average thickness that is between 0.5 nm and 2 nm, and more preferably between 0.8 nm and 1.4 nm, in particular where it comprises MgO.

According to another aspect, the invention is embodied as a memory device. The latter comprises a plurality of spin-transfer torque magnetic tunnel junctions such as evoked above. The memory device is otherwise configured to generate a spin-polarized current flow across each of the junctions.

According to a final aspect, the invention is embodied as a method of operation of a spin-transfer torque magnetic tunnel junction such as discussed above. Basically, the method comprises generating a spin-polarized current flow from the pinned layer to the free layer, to initiate an asymmetrical switching of the magnetization orientation of the free layer (e.g., to write and store a "1" into the junction). I.e., the switching is initially off-centered toward an edge of the stack, as per a configuration of the junction. To that aim, the current flow generated may be off-centered toward an edge of the stack, as per the configuration of the junction, consistently with principles evoked above.

In embodiments where the magnetization orientation of the free layer need be reversed (and set the free layer back to a "0" state), one may generate a second current flow, this time from the free layer to the pinned layer, e.g., using a current flow that is again off-centered toward an edge of the stack, due to the configuration of the junction, to switch a magnetization orientation of the free layer back to an initial magnetization state.

Devices and methods embodying the present invention will now be described, by way of non-limiting examples, and in reference to the accompanying drawings.

Figure 2:
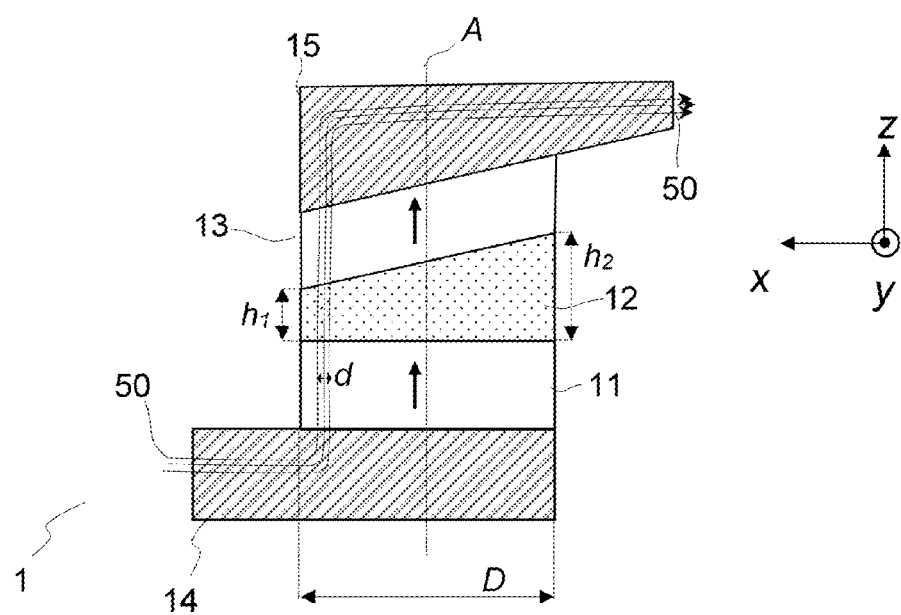
FIGS. 2-4 are 2D cross-sectional views of magnetic tunnel junctions, according to distinct embodiments.

The accompanying drawings show simplified representations of devices or parts thereof, as involved in embodiments. Technical features depicted in the drawings are not to scale. In particular, the tilt of the insulating barrier in FIG. 2 is exaggerated, for the sake of depiction. Similar or functionally similar elements in the figures have been allocated the same numeral references, unless otherwise indicated.

DETAILED DESCRIPTION

A magnetic tunnel junction (MTJ) consists of two ferromagnetic layers separated by a thin insulating spacer layer, which acts as tunneling barrier. If this barrier is thin enough, electrons can tunnel from one side to the other. The magnetization direction of one of the ferromagnets (the "pinned" layer, also called "fixed" or "reference" layer) is kept fixed, whereas the magnetization direction of the other is free to rotate (the "free" layer). Electrons tunneling from the pinned layer are preferentially spin-polarized according to the magnetization direction of the pinned layer. Only those electrons whose spin directions match the magnetization direction of the free layer will tunnel efficiently and enter the free layer. Therefore, parallel vs. antiparallel alignment of the two magnetization directions leads to a difference in electrical resistance between the two states. This tunneling magnetoresistance (TMR) can be as large as 300% at room temperature for a tunneling barrier made of, e.g., MgO.

Figure 1:
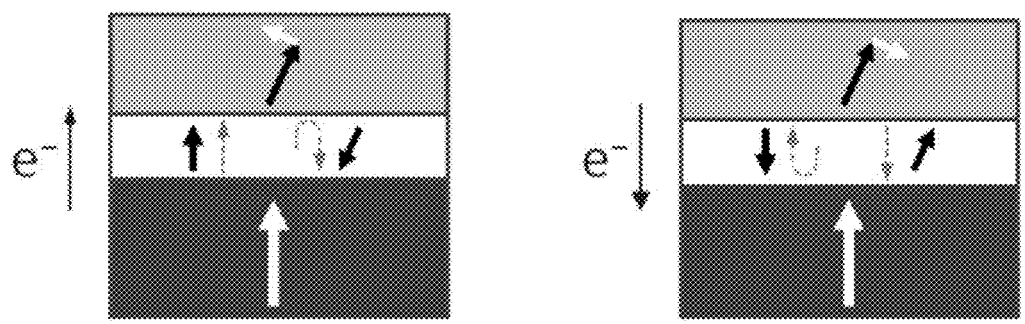
FIG. 1 illustrates general principles of switching of a perpendicularly magnetized magnetic tunnel junction by spin-transfer torque, which principles are relied upon in embodiments of the invention.

FIG. 1 illustrates the switching of a typical, perpendicularly magnetized MTJ by a spin-transfer torque mechanism, as understood by the present Inventors. The MTJ shown (in cross-section) is slightly asymmetric; the reference layer (bottom) is indeed usually slightly thicker than a usually thinner free layer (top). The depicted MTJ has a perpendicular magnetization direction. The spacer is a tunneling barrier. Two cases are sketched with opposite current directions (the arrow labeled "e−" indicates the electron flow direction) and nearly aligned magnetization directions in the reference and the free layer. The current is partly transmitted and partly reflected, as indicated in the barrier, together with the majority spin directions. The transverse spin component is responsible for spin-transfer torque switching, whereas the longitudinal component exerts no torque. On the left-hand side, the electron flow from the reference to the free layer stabilizes the parallel alignment of the two layers. On the right hand side, the electron flow from the free to the reference layer destabilizes the parallel alignment of the two layers, eventually leading to a reversal of the magnetization of the free layer by the reflected current. If the two magnetization directions are antiparallel, then electron flow from the free to the reference layer stabilizes the free layer's magnetization. Similar principles are relied upon in the present invention, except that the STT-MTJ is further engineered to promote, constrain or constrict the current flow, so as for the latter to be off-centered.

In reference to FIGS. 2-5, an aspect of the invention is first described, which concerns a spin-transfer torque magnetic tunnel junction 1, 1a, 1b, i.e., a junction whose operation principle relies on the spin-transfer torque effect. Basically, the magnetic tunnel junction (MTJ) comprises a layer stack 11-13b with two magnetic layers and an insulating barrier layer 12-12b. The two magnetic layers, also called ferromagnets, include a pinned layer 11-11b and a free layer 13-13b. The insulating barrier layer 12-12b is between the two magnetic layers.

The pinned layer 11-11b, also referred to as a fixed magnetic layer or reference layer, has a fixed magnetization, which will not be appreciably changed by the current flow. This may for instance be achieved by coupling the magnetization of this layer to another magnetic layer stack with high magnetic anisotropy, as known per se. The insulating layer 12-12b is sometimes referred to as a spacer or a tunneling barrier. Its thickness need be small enough, typically 1 nm, to enable sufficient current to flow from one of the magnetic layers to the other. The free layer 13-13b (on top in the appended drawings) is usually thinner than the pinned layer; it is the layer in which magnetization can easily reverse its direction.

Figure 3:
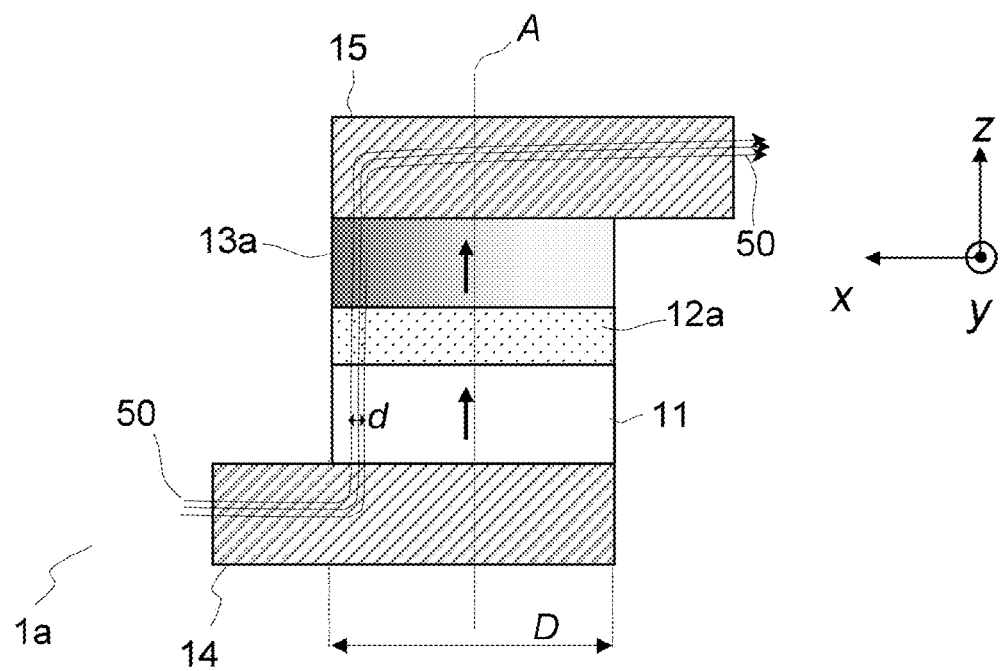
Figure 4:
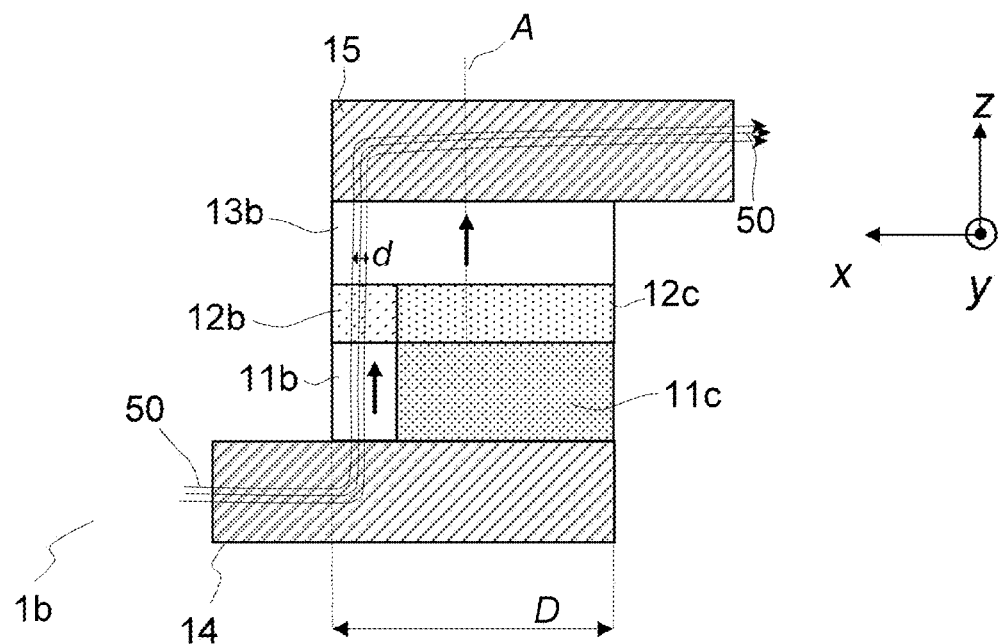
Figure 5:
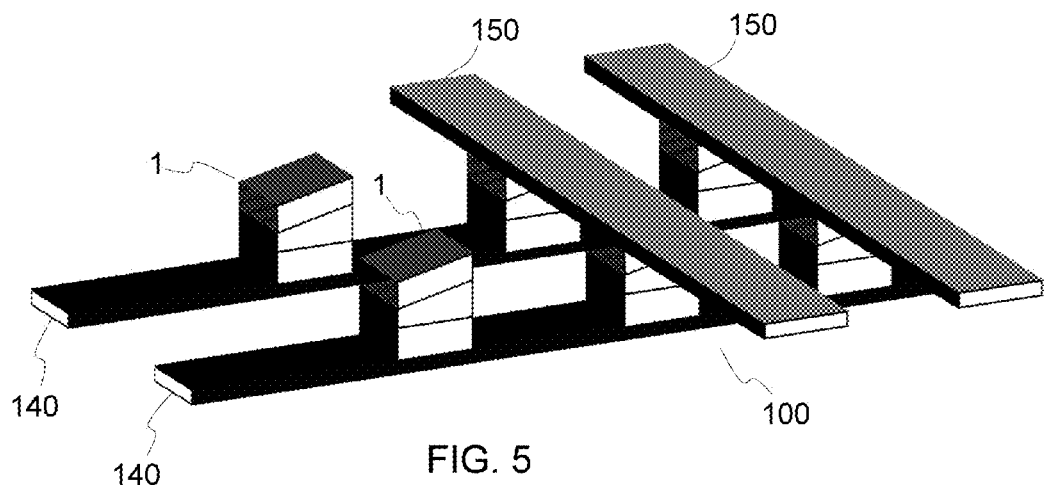
FIG. 5 is a (partial) 3D view of a memory device comprising a plurality of magnetic tunnel junctions such as depicted in FIG. 2, according to embodiments.

The present devices may typically comprise additional components and/or material layers (not necessarily shown here, for conciseness), e.g., a seed layer, underneath the pinned layer, a capping layer, above the free layer, and circuitry (source line, word and bit lines and contacts to inject current into the junctions). Typically, the capping layer would be located between layers 13 and 15, the seed layer would be between layers 11 and 14, while the circuitry is outside layer 15 and/or layer 15. The layer sequence 11-13, however, will likely remain as depicted in FIGS. 2-4. I.e., the free layer 13-13b will normally coat the insulating layer 12-12b directly and the latter will normally be directly on top of the fixed layer 11-11b.

Each of the two magnetic layers 11-11b, 13-13b has an out-of-plane magnetization orientation, i.e., a magnetization orientation that is transverse to the average planes of such layers, as opposed to in-plane configurations, where the magnetization orientation lies in the planes of the magnetic layers. Out-of-plane magnetization orientations are sometimes referred to as "perpendicular" orientation, although the magnetization orientations may not be strictly perpendicular. In general, out-of-plane magnetization orientations in MTJs are advantageous over in-plane magnetized MTJs because of their potential higher efficiency in switching the free layer 13-13b, as noted earlier. Thus, the switching current can be reduced, which enables low power devices.

Remarkably, the present STT-MTJs 1, 1a, 1b are further configured so as to allow a transverse, spin-polarized current flow 50 (i.e., generated from one of the two magnetic layers to the other) to initiate an asymmetrical switching of the magnetization orientation of the free layer. That is, the switching of the free layer is off-centered toward an edge of the stack.

In embodiments such as discussed in reference to FIGS. 2-4, the asymmetrical switching is achieved thanks to an off-centered, transverse spin-polarized current flow 50 from one of the two magnetic layers to the other. The off-centered current will, in turn, initiate the asymmetrical switching. However, in other specific embodiments, a junction can be designed such that even a symmetric current flow may result in an asymmetrical switching. This is discussed later in detail.

In all cases, the current flow is typically generated by applying a small potential between electrodes 14, 15 that are in electrical communication with the magnetic layers. The current flow 50 generated is typically perpendicular to the average plane of the stack, parallel to the stacking direction, as depicted in the appended drawings.

Surprisingly enough, ensuring an asymmetrical switching of the free layer results in further decreasing the minimal current for switching, as exemplified below. The minimal current needed can potentially be reduced by a factor two, as demonstrated by simulations performed by the present Inventors.

According to the present solutions, the spin-transfer torque is made to locally vary across the cross-section of the MTJ, so that the tendency to switch the magnetization in the free layer 13-13b is different at different locations. In this way, magnetization reversal can be made to start at a well-defined location, extending then to the entire free layer by exchange. The spin-torque efficiency parameter can be made to locally vary by making the current density through the MTJ inhomogeneous. Having realized this, different designs of STT-MTJs can be contemplated, which allow to achieve this effect. For instance, three classes of embodiments are described below in detail in reference to FIGS. 2-4. Yet, other variants can be contemplated, as evoked in the present description.

In the embodiment of FIG. 2, a laterally varying current density is achieved by laterally varying the barrier thickness. This approach adds an additional handle to tailoring MTJs, since critical material parameters can be kept invariant and only the device geometry is modified. Similarly, in FIG. 4, the diameters of the insulator 12b and the fixed layer 11b are reduced and the layers off-centered. More generally, laterally varying the tunneling transmission probability in the insulating barrier may result in a comparable effect. Alternatively, in embodiments such as illustrated in FIG. 3, the magnetic properties of the free layer or the interface of the free layer to the insulator is locally modified to serve the same purpose. All these approaches lead to reduced switching currents, and hence enable low-power devices. Note that a lateral variation of any property of a layer as used herein means a variation of this property, across the layer, i.e., along a cross-section of that layer, in a direction perpendicular to the stacking direction.

Referring first to the embodiment of FIG. 2: Here the STT-MTJ is designed so as for the insulating barrier layer 12 to have a laterally varying thickness. The layer 12 will accordingly exhibit a reduced thickness at an edge thereof. As a result, the junction 1 favors current flows 50 that are off-centered toward the edge of reduced thickness $h_1$. Note that, in FIG. 2, the magnetization direction (represented by a thick, vertical arrow) of the free layer would typically be slightly tilted, as per the orientation of the insulating layer 12, notwithstanding the depictions used in the drawing.

In particular, the thickness of the insulating layer may vary from a first value $h_1$ to a second value $h_2$, wherein $0.5 h_2 \leq h_1 < h_2$. For example, one may use $h_1 \leq h_2 - 0.2$ nm. The lateral barrier thickness gradient gives rise to current confinement at the thinnest edge, as symbolically depicted in FIG. 2. Assuming that the insulating barrier otherwise has suited tunneling characteristics, the current generated across the stacked layers 11-13 turns out to be confined to those areas which have a slightly smaller thickness (and hence a larger transmission probability). The current confinement effectively increases the current density 4 value locally to make the free layer 13 switch at lower overall 4. This will be more effective if the exchange length is smaller than the pillar's diameter D.

The embodiment of FIG. 2 makes it relatively easy to fabricate the junction. In variants to: (i) the magnetic properties about the free layer can be varied; (ii) the insulating barrier layer may have a laterally varying electron transmission probability; or (iii) the fixed and insulating layers be explicitly off-centered, as discussed below in reference to FIGS. 3 and 4.

In embodiments such as illustrated in FIG. 3, the free layer 13a and/or an interface between the free layer 13a and the insulating barrier layer 12a may have (one or more) laterally varying magnetic properties. This variation is symbolically depicted by a graded filling of layer 13a in FIG. 3. As it may be realized, suitably varying magnetic properties along layer 13a and/or its interface with layer 12a may also allow an asymmetric switching to be initiated in the free layer. The laterally varying magnetic properties shall preferably include the magnetization and/or the magnetic anisotropy of the free layer 13a and/or said interface.

Now, provided certain conditions are met, the lateral variations of the magnetic properties across layer 13a and/or its interface with layer 12a may also result in off-centering the current flow 50 toward an edge of the stack, as explicitly illustrated in FIG. 3. Thus, two cases may be distinguished:

Magnetic properties are laterally varied and an off-centered current flow is generated, as illustrated in FIG. 3; and Magnetic properties are laterally varied but a homogeneous current flow is relied upon.

In the latter case, although a homogeneous current density is generated, this current is only capable to initiate magnetization switching at a position that is determined by the asymmetric (off-centered) magnetic properties, i.e., where the threshold for switching is surpassed.

In the former case, relying additionally on an off-centered current flow provides more flexibility with respect to the material properties because the asymmetry of the magnetic properties and the off-centering of the current flow support each other and each contribute to obtain the desired effect, i.e., an asymmetric switching in the free layer.

Referring now to FIG. 4: the pinned layer 11b and the insulating barrier 12b may, in embodiments, be made narrower than the free layer and off-centered with respect to the latter. Namely, one or each of the pinned layer 11b and the insulating barrier layer 12b may have an average diameter that is less than the average diameter of the free layer 13b and be off-centered toward an edge of the stack, as schematically rendered in FIG. 4 (see also FIG. 7). This too may result in off-centering the current flow 50, in operation, for the reasons discussed below. The average diameters of layers 11b-13b are measured in average planes of the respective layers, perpendicularly to the stacking direction. The case depicted in FIG. 4 and FIG. 7 assumes that each of the layers 11b and 12b is of reduced diameter and off-centered. Of course, other layers or layer portions 11c and 12c will typically be present in the stack, complementing the layer portions 11b and 12b.

Given that the insulating barrier 12b is slightly "leaky", it is sufficient that one of the two layers 11b, 12b be reduced and off-centered, owing to the other layers or layer portions 11c, 12c that otherwise complement the layer portions 11b and 12b. Indeed, if the barrier 12b has a reduced diameter, the layer portion 12c that complements the barrier 12b (at the level thereof) must be insulating too, to prevent shortcuts from layer 11b to layer 13. Even, the complementing layer portion 12c should typically be more insulating than the reduced layer portion 12b. This amounts to have an effective barrier layer 12b, 12c that has graded properties.

More generally, a similar effect can be obtained by designing the insulating barrier layer so as for it to have a laterally varying electron transmission probability, e.g., by laterally varying a dopant concentration in the insulating barrier. A lateral variation of dopants in the insulating barrier can for instance be achieved by implanting ions or by oxidizing one side of the barrier. This way, a graded, perpendicular "conductivity" may occur across the insulating barrier, which results in off-centering the current. In that sense, the geometry of FIG. 4 can be regarded as a particular case of a laterally varying electron transmission probability, exhibiting two regions 12b, 12c of distinct transmission probabilities, wherein conductivity vanishes or strongly reduces at the level of the layer portion 12c, compared to the transmission probability at the level of the portion 12b.

If, now, the barrier layer 12b is not reduced (or equivalently if the global barrier 12b, 12c is made of one, homogeneous material having constant insulating properties across the layer) but only the layer 11b has a reduced diameter, then a spin-polarized current will only locally be created in the area 12b, which in turn allows an off-centered switching to occur. A fortiori, off-centered switching will occur if both the barrier layers 12b and the pinned layer 11b have a reduced diameter and are off-centered.

In each of the embodiments of FIGS. 2-5, the junctions 1, 1a, 1b may be designed such that the current flow 50 obeys certain conditions. To start with, the distance l by which the current flow 50 (e.g., as seen at the level of the free layer) is off-centered from the center of the free layer 13-13b shall preferably fulfill the condition 2 nm≤l<D/2, where D is the average diameter of the free layer, as measured in an average plane thereof, i.e., perpendicularly to the stacking direction. That is, the shift l should preferably be larger than (or equal to) 2 nm, so as to appreciably impact the minimal switching current, as simulations have shown. This is discussed in detail below. On the other hand, the shift l cannot be larger than the radius D/2 of the free layer. Note that the above condition for the shift l will normally hold when the shift is measured from the axis of the pillar, which is normally identical (or quasi-identical) to the perpendicular axis A of the free layer.

In addition, the junctions 1, 1a, 1b may, in embodiments, further be designed so that the current flow 50 occurs along a current filament having an average diameter d that fulfills the condition $L_e$≤d<D/2, where $L_e$ represents an average exchange length of the two magnetic layers. The diameter d represents an average diameter of the filament as occurring across the layer stack 11-13b. By selecting materials and conditions such that the average diameter d is at least equal to the exchange length of the magnetic materials, the spins can be excited into a soft spin wave mode, which generates a well-defined location of excited spins, initiating precessional motion leading eventually to magnetization reversal. The exchange length varies from one material to the other. However, for perpendicularly magnetized materials as contemplated herein the exchange length shows little dispersion: there is no wide spread in the variations of the exchange length, which is typically between 3 and 6 nm. For example, materials for the magnetic layers may for instance be chosen so as for the average diameter d of the current filament to fulfill the condition 4 nm≤d≤D/2.

The sizes of the pillars depend on the application. For example, high-density devices may require the average diameter D of the stack to be on the order of 6 or 8 nm, or slightly larger. As it may be realized, the diameter D should preferably not be smaller than the exchange length of the magnetic materials (3-6 nm).

Larger pillars may, however, be afforded where the density is not critical. However, the average diameter D of the stack should preferably be less than or equal to 100 nm, else the off-centering of the current filament may not have substantial effects on the minimal switching current anymore, in particular also because the spin-transfer torque effect will be less dominant. For example, the average diameter D of the stack may be less than or equal to 32 nm, or 28 nm.

Each of the two magnetic layers shall preferably comprise a CoFeB compound. Several stoichiometries can be contemplated for the elements Co, Fe and B, as known in the field of STT-MRAM. For such materials, the effect of off-centering the current filament on the switching current has led to promising results. Yet, the pinned layer and/or the free layer may comprise, each, sublayers, for example they may be deposited as a stack of alternating Co and Pt layers, Co and Pd layers, or as multiple CoFeB layers with different compositions, as already known for STT-MRAMs. More generally, any layer 11-13 of the stack may in fact comprise sublayers and be otherwise structured. The insulating barrier layers 12-12b preferably comprise MgO.

The free layer 13-13b preferably has an average thickness that is between 1 nm and 4 nm. It is typically slightly thinner than the fixed layer, which preferably has an average thickness that is between 6 nm and 10 nm. A range of 6 to 10 nm for the fixed layer is compatible with the insertion of additional coupling layers, if necessary, and as evoked earlier. The insulating barrier layer 12-12b preferably has an average thickness that is between 0.5 nm and 2 nm, to enable sufficient transmission of electrons, i.e., sufficient tunneling. More preferably, the thickness of the insulating barrier may be between 0.8 nm and 1.4 nm, e.g., of about 1 nm. If MgO is used, the average thickness of the insulating barrier should even preferably be between 1 and 1.2 nm.

Using materials and thicknesses as described above allows magnetic tunnel junctions to be obtained, which have, e.g., a minimal switching current that is less than 50 $\mu$A at a switching rate of 0.1 ns$^{-1}$. That is, the minimal switching current required can be reduced by a factor of approximately two, compared to prior devices.

Figure 7:
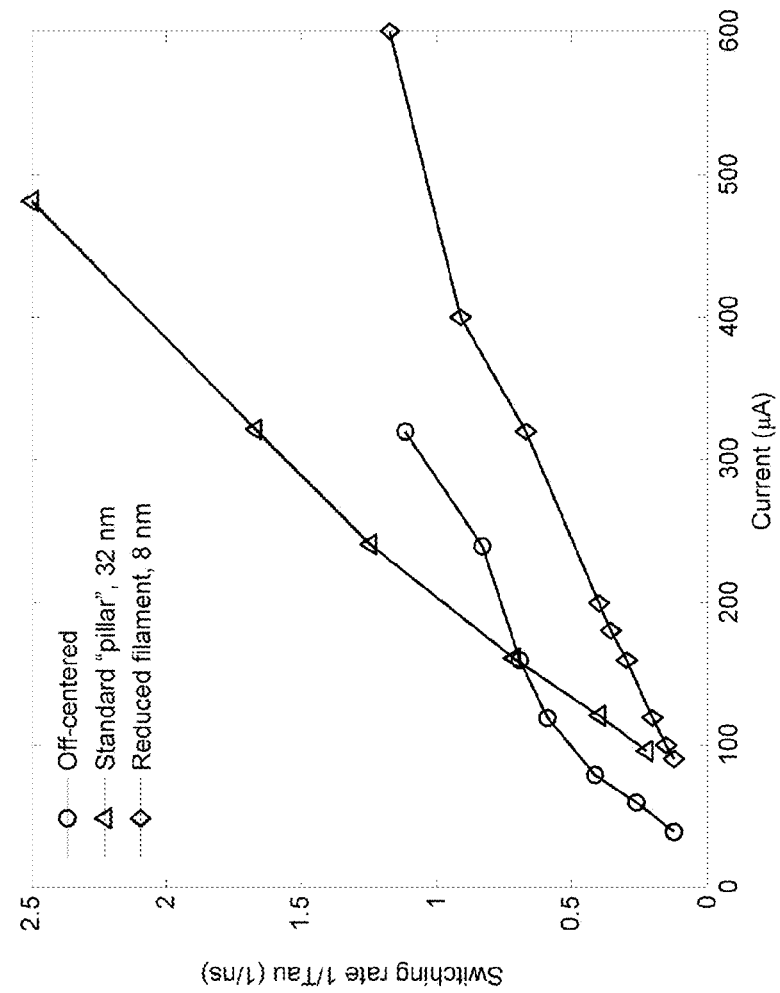
FIG. 7 is a plot representing minimal switching currents required for switching the free layers of various modelled junctions, including an off-centered junction as in FIG. 4, and as obtained by simulations performed by the Inventors.
Figure 7:
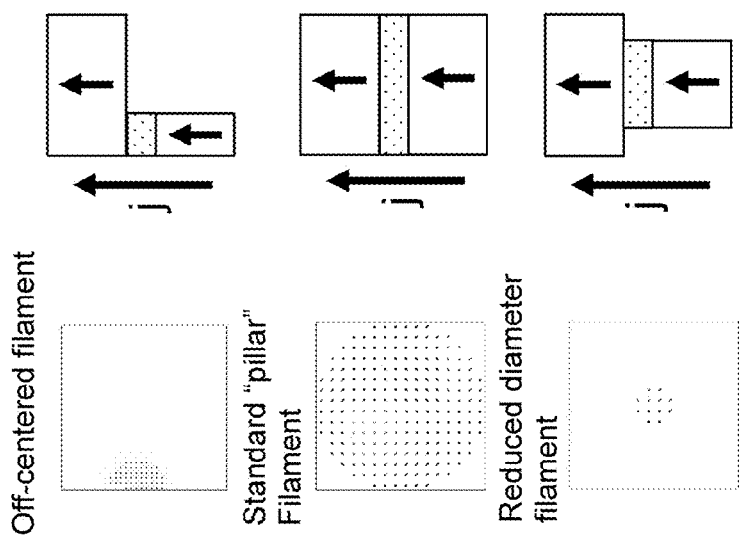

In order to ease the comparison of the performance of the present approach with prior solutions, the Inventors have run various simulations, see FIG. 7, using various possible displacement l of the current filament from the center, i.e., within the range $0 \leq l \leq D/2$, and using various possible values of D (e.g., the value D=32 nm was used for the results reported in FIG. 7). The current filament was considered to be cylindrical, with diameter d. Having a perfectly cylindrical shape is, however, not critical in practice, and real current filaments are typically not perfectly cylindrical. Note that displacement as large as l=D/2 can be considered, which correspond to an edge filament that is a half-cylinder. Still, a switching current reduction can be expected, according to the simulations performed.

As it turned out, an important condition for the switching current reduction is not that the filament is touching the edge but that it is displaced from the center. At least, the devices should be designed so as for the initial switching of the free layer to be off-centered. So, even if l is small compared to D/2, e.g., l=2 nm, the switching current happens to be appreciably reduced. A possible interpretation is that the magnetization reversal need be asymmetric. Thus, symmetry breaking in the spin wave mode during reversal can be exploited, as in the present solutions.

A precision of 2 nm for the displacement/(which appears in the previous condition 2 nm$\leq l \leq$D/2) may still be difficult to achieve experimentally. Yet, micromagnetic simulations show that such a value suffices, in principle, to obtain appreciable effects on the switching current.

The relevant Landau-Lifshitz-Gilbert equation was solved within the so-called "OOMMF" framework, which was extended to include spin-transfer torque terms, as described in [1]. The spin-transfer simulation code used is described in [6]. The code was adapted to pillar geometry as discussed in [7]. The simulation results are now discussed in detail.

For the purpose of the simulations, the MTJ pillars had circular cross sections, typically of 32 nm diameter. Material parameters and layer thicknesses for the free and reference layer were chosen in agreement with typical, state-of-the-art perpendicularly magnetized pillars [5]. Namely, the free layer magnetization was set to $M_s$=800 kA/m and the anisotropy field to $H_k$=240 kA/m=3 kOe. The damping constant retained was $\alpha$=0.01. For the reference layer, parameters were taken as follows: $M_s$=1200 kA/m, $H_k$=800 kA/m=10 kOe, and $\alpha$=0.1. The thicknesses of the free and reference layer were 2 nm and 8 nm, respectively, with an insulating barrier of 1 nm in between. The reference layer was kept magnetically fixed, using an exchange coupling to a biasing layer underneath. The cell sizes considered for the simulations were 1 and 2 nm. The geometry of FIG. 4 was assumed, although complementary layer portions 11c, 12c of FIG. 4 where ignored. I.e., the current confinement at the edge was mimicked by assuming geometric modifications to the reference layer, also because the insulating oxide cannot be micromagnetically modeled.

FIG. 7 shows simulation results obtained by comparing: (i) an off-centered confinement geometry (upper geometry, where the current filament was constrained at an edge of the circular pillar, using a geometry similar to that of FIG. 4); (ii) a standard pillar geometry (with a 32 nm diameter) and (iii) a pillar in which current is confined to the same area as for the off-centered case, but centered. As it can be seen in the plot of FIG. 7, the prior configurations (standard pillar and current confined to the center) result in essentially the same critical switching currents, while the off-centered geometry leads to a reduction of the minimal switching current $Ic_0$ of at least a factor of two, e.g., at a fixed switching rate of 0.1 ns$^{-1}$. This reduction can actually be seen for both current polarities, i.e., switching from the parallel (P) to the antiparallel state (AP) and vice versa.

As it could be concluded from various simulations and experiments conducted by the Inventors, the switching current reduction is a robust effect: the exchange stiffness was varied to test the spinwave influence on the edge filament switching. Yet, the switching current threshold reduction did not appear to appreciably depend on particulars of the exchange length and spinwaves, provided that certain conditions are fulfilled, e.g., 2 nm$\leq l <$D/2 and $L_e \leq$d$<$D/2, as seen earlier. Finally, one may question the impact of the simulated geometric modifications to the reference layer (due to the fact that the insulating oxide cannot be micromagnetically modeled). As it can be realized, such modifications happen to change the Oersted field in the switching (free) layer. Yet, as further simulations have shown, the inclusion of a more realistic Oersted field did not appear to change the switching current. Since the switching current threshold reduction was found to be essentially independent from the details of the Oersted field chosen, one concludes that the switching current reduction is a robust effect.

Present MTJs may be obtained by patterning MTJ devices first by methods known in the art (i.e., using physical vapor deposition, photolithography, reactive ion etching, ion beam etching, and similar techniques) and then using any suitable technique to modify the physical or chemical structure at an edge of the stack (at the insulating barrier, the free layer, or the reference layer) in order to promote localized conductivity changes (effectively, a current constriction) or changes to the magnetization or the magnetic anisotropy strength. An example of such a technique would be a directional ion beam, which can be used to:

- Selectively change the crystal structure of the barrier, the free layer and/or the reference layer;
- Implant ions into one side of the barrier, the free layer and/or the reference layer, to make one edge of the device more conductive;
- Oxidize one side of the barrier, the free layer and/or the reference layer, to make one edge of the device less conductive; or
- Add material to one side of the device to make it more conductive.

In addition, the use of sidewall masks or sacrificial layers, e.g., based on conformal thin SiN or other dielectric film, or a judicious use of shadowing from a nearest neighbor MTJ device in an array of such devices, could furthermore be used to refine the edge modification process.

Next, according to another aspect, the invention can be embodied as a memory device 100. Such a device is partly illustrated in FIG. 5. It comprises a plurality of spin-transfer torque magnetic tunnel junctions 1 (or 1a, 1b), such as described earlier. The memory device 100 is generally configured to generate a spin-polarized current flow across each of the junctions. To that aim, the device 100 may notably comprise current control means, e.g., including word lines 140 and bit lines 150, so as to apply suitable control voltages and selectively switch the magnetization orientation of the free layer 13 of each of the MTJs 1.

In particular, the present devices can be embodied as spin-transfer torque random access memory (STT-RAM) devices, or be used in logic circuits based on STT-MTJs. Such devices do not require to apply an external magnetic field. Rather, the switching between the different magnetic states occurs due to the spin-transfer torque produced by the current flowing through the stacks of the STT-MTJs. Because their spin orientation changes in the free layer, electrons exert a torque on the magnetization of this layer, which may, in turn, cause magnetization switching, provided the torque is large enough to overcome the damping. By changing the current polarity the magnetization of the free layer can be switched from anti-parallel to a parallel state (and conversely) with respect to the reference layer. In general, scalability will not be an issue for the STT-MRAM cell, since reducing the size of the cell leads to a reduction in the current required for switching.

Figure 6:
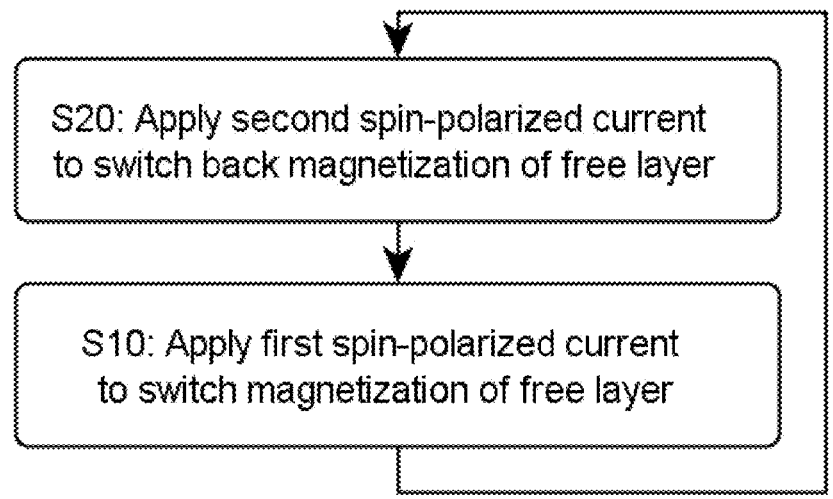
FIG. 6 is a flowchart illustrating high-level steps of a method of operating a magnetic tunnel junction, according to embodiments.

Next, according to a final aspect, the invention can also be embodied as a method of operation of a STT-MTJ 1, 1a, 1b as already described above in reference to FIGS. 2-4. The method essentially revolves around the two steps depicted in FIG. 6. First, step S10, a spin-polarized current flow 50 is generated across the pillars of the MTJs, i.e., from the pinned layer 11-11b to the free layer 13-13b. The generated current flow initiates an asymmetrical switching of the magnetization orientation of the free layer, as per a configuration of the junction 1, 1a, 1b, as already discussed earlier. In particular, the current flow 50 generated may be off-centered toward an edge of the stack. This results in switching the magnetization orientation of the free layer 13-13b. If the MTJ is used as a memory device, this operation may be regarded as a write operation, e.g., to write a "1", and so as to store information.

Should this information be erased, the method may further comprise a second step, S20, wherein, after having generated a first current flow as described below, a second current flow (not shown) is generated across the stack, this time from the free layer 13-13b to the pinned layer 11-11b, e.g., perpendicularly to the two magnetic layers and the insulating barrier layer 12-12b in between. Again, the second current flow may be off-centered toward an edge of the stack. This second operation results in switching the magnetization orientation of the free layer 13-13b back to the initial magnetization state of the free layer.

Some of the method and devices described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention be not limited to the particular embodiments disclosed, but that the present invention will include all embodiments falling within the scope of the appended claims. In addition, many other variants than explicitly touched above can be contemplated. For example, other insulating or magnetic materials than those explicitly disclosed may be used for the layers 11-13b of the pillars.

What is claimed is:

1. A spin-transfer torque magnetic tunnel junction, comprising:
   a layer stack with
      two magnetic layers, including a pinned layer and a free layer; and
      an insulating barrier layer between the two magnetic layers,
   wherein:
      each of the two magnetic layers has an out-of-plane magnetization orientation; and
      one or each of the pinned layer and the insulating barrier layer has an average diameter less than an average diameter of the free layer and is off-centered from a center of the free layer toward an edge of the layer stack for guiding an off-centered flow of spin-polarized current from one of the two magnetic layers to the other on application of a control voltage to the layer stack, wherein each average diameter is measured in a plane perpendicular to a stacking direction of the layer stack, whereby the junction is configured so as to initiate an asymmetrical switching of the magnetization orientation of the free layer on application of the control voltage.

2. The magnetic tunnel junction according to claim 1, wherein
a distance l by which the current flow is off-centered from a center of the free layer fulfills a condition 2 nm≤l<D/2, where D is an average diameter of the free layer, as measured in an average plane of the free layer, transversely to a stacking direction of the layer stack.

3. The magnetic tunnel junction according to claim 2, wherein
the current flow occurs, in operation of the junction, along a current filament having an average diameter d, which fulfills a condition $L_e \leq d < D/2$, where $L_e$ represents an average exchange length of the two magnetic layers.

4. The magnetic tunnel junction according to claim 3, wherein
the average exchange length $L_e$ of the two magnetic layers is between 3 nm and 6 nm.

5. The magnetic tunnel junction according to claim 4, wherein
the average diameter d of the current filament fulfills a condition 4 nm≤d≤D/2.

6. The magnetic tunnel junction according to claim 2, wherein
the average diameter D of the layer stack is larger than 6 nm.

7. The magnetic tunnel junction according to claim 2, wherein
the average diameter D of the layer stack is less than or equal to 100 nm.

8. The magnetic tunnel junction according to claim 7, wherein
the average diameter D of the layer stack is less than or equal to 32 nm.

9. The magnetic tunnel junction according to claim 1, wherein
each of the two magnetic layers comprises a CoFeB compound.

10. The magnetic tunnel junction according to claim 9, wherein
the free layer has an average thickness that is between 1 nm and 4 nm.

11. The magnetic tunnel junction according to claim 10, wherein
the pinned layer has an average thickness that is between 6 nm and 10 nm.

12. The magnetic tunnel junction according to claim 1, wherein
the insulating barrier layer comprises MgO.

13. The magnetic tunnel junction according to claim 1, wherein
the insulating barrier layer has an average thickness between 0.5 nm and 2 nm.

14. The magnetic tunnel junction according to claim 1, wherein
the insulating barrier layer has an average thickness that is between 0.8 nm and 1.4 nm.

15. A memory device, comprising:
a plurality of spin-transfer torque magnetic tunnel junctions, each in turn comprising:
a layer stack with
two magnetic layers, including a pinned layer and a free layer; and
an insulating barrier layer between the two magnetic layers,
wherein:
each of the two magnetic layers has an out-of-plane magnetization orientation; and
one or each of the pinned layer and the insulating barrier layer has an average diameter less than an average diameter of the free layer and is off-centered from a center of the free layer toward an edge of the layer stack for guiding an off-centered flow of spin-polarized current from one of the two magnetic layers to the other on application of a control voltage to the layer stack, wherein each average diameter is measured in a plane perpendicular to a stacking direction of the layer stack, whereby the junction is configured so as to initiate an asymmetrical switching of the magnetization orientation of the free layer on application of the control voltage; and
means for selectively applying control voltages to one or more of the plurality of junctions.

16. A method of operation of a spin-transfer torque magnetic tunnel junction, the method comprising:
providing the spin-transfer torque magnetic tunnel junction, the spin-transfer torque magnetic tunnel junction comprising:
a layer stack with two magnetic layers, including a pinned layer and a free layer; and
an insulating barrier layer between the two magnetic layers,
wherein:
each of the two magnetic layers has an out-of-plane magnetization orientation; and
one or each of the pinned layer and the insulating barrier layer has an average diameter less than an average diameter of the free layer and is off-centered from a center of the free layer toward an edge of the layer stack for guiding an off-centered flow of spin-polarized current from one of the two magnetic layers to the other on application of a control voltage to the layer stack, wherein each average diameter is measured in a plane perpendicular to a stacking direction of the layer stack, whereby the junction is configured so as to initiate an asymmetrical switching of the magnetization orientation of the free layer on application of the control voltage; and
generating an off-centered spin-polarized current flow from the pinned layer to the free layer, to initiate an asymmetrical switching of the magnetization orientation of the free layer, by applying a control voltage to the layer stack.

17. The method according to claim 16, wherein
the off-centered spin-polarized current flow is a first current flow,
the method further comprising, after having generated the first current flow:
generating a second current flow, from the free layer to the pinned layer, wherein the second current flow is off-centered toward the edge of the layer stack, as per a configuration of the junction, to switch a magnetization orientation of the free layer back to an initial magnetization state.

* * * * *